(12) United States Patent
Luo et al.

(10) Patent No.: US 11,586,311 B2
(45) Date of Patent: Feb. 21, 2023

(54) DISPLAY PANEL AND DISPLAYING DEVICE

(71) Applicants: Chengdu BOE Optoelectronics Technology Co., Ltd., Sichuan (CN); BOE Technology Group Co., Ltd., Beijing (CN)

(72) Inventors: Hongqiang Luo, Beijing (CN); Kwang Gyun Jang, Beijing (CN); Ke Liu, Beijing (CN); Guiyu Zhang, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/508,899

(22) Filed: Oct. 22, 2021

(65) Prior Publication Data
US 2022/0269364 A1 Aug. 25, 2022

(30) Foreign Application Priority Data

Feb. 24, 2021 (CN) .......................... 202110209350.9

(51) Int. Cl.
*G06F 3/041* (2006.01)
*H05K 1/02* (2006.01)

(52) U.S. Cl.
CPC ........... *G06F 3/0412* (2013.01); *H05K 1/028* (2013.01); *H05K 1/0218* (2013.01); *G06F 2203/04102* (2013.01); *H05K 2201/10128* (2013.01)

(58) Field of Classification Search
CPC ......... G06F 2203/04111; G06F 3/0416; G06F 3/04164; G06F 3/0445
See application file for complete search history.

(56) References Cited

U.S. PATENT DOCUMENTS

| 2002/0180344 | A1 | 12/2002 | Lichtfuss | |
| 2019/0064962 | A1* | 2/2019 | Bye | G06F 3/041662 |
| 2019/0220122 | A1* | 7/2019 | Shin | H01L 51/5253 |
| 2021/0004101 | A1 | 1/2021 | Wei et al. | |

(Continued)

FOREIGN PATENT DOCUMENTS

| CN | 107300793 A | 10/2017 |
| CN | 107393422 A | 11/2017 |

(Continued)

OTHER PUBLICATIONS

CN202110209350.9 first office action.

*Primary Examiner* — Van N Chow
(74) *Attorney, Agent, or Firm* — IPro, PLLC

(57) ABSTRACT

The disclosure provides a display panel and a displaying device. The display panel comprises a bonding area and an active area; a flexible printed circuit board, the flexible printed circuit board being arranged on a side, away from the active area, of the bonding area, and comprising a display signal line which extends in a first direction and is electrically connected to the bonding area; and a touch driving line and a signal receiving line, the touch driving line and the signal receiving line being connected to the flexible printed circuit board from the active area via the bonding area, and the display signal line not overlapping with the touch driving line or the signal receiving line.

10 Claims, 3 Drawing Sheets

(56) References Cited

U.S. PATENT DOCUMENTS

| | | | |
|---|---|---|---|
| 2021/0064841 A1* | 3/2021 | Kim | G06F 3/03545 |
| 2021/0097900 A1 | 4/2021 | Cui | |
| 2021/0181888 A1 | 6/2021 | Yan et al. | |
| 2021/0405790 A1* | 12/2021 | Zhao | G06F 3/0443 |
| 2022/0066609 A1* | 3/2022 | Han | G06F 3/0412 |

FOREIGN PATENT DOCUMENTS

| | | |
|---|---|---|
| CN | 110187797 A | 8/2019 |
| CN | 110914792 A | 3/2020 |
| CN | 210983365 U | 7/2020 |
| CN | 111522463 A | 8/2020 |
| CN | 112035013 A | 12/2020 |
| CN | 112817481 A | 5/2021 |

* cited by examiner

| 006 |
|---|
| 005 |
| 004　　　　　414 |
| 003 |
| 60 |
| 002 |
| 001 |

Fig. 3

DISPLAY PANEL AND DISPLAYING DEVICE

CROSS REFERENCE OF RELATED APPLICATIONS

The application claims priority to Chinese Patent Application No. 202110209350.9, entitled "DISPLAY PANEL AND DISPLAYING DEVICE", filed with the China National Intellectual Property Administration on Feb. 24, 2021, which is incorporated herein by reference in its entirety.

TECHNICAL FIELD

The disclosure relates to the technical field of display, in particular to a display panel and a displaying device.

BACKGROUND

At present, in an FMLOC structure of an OLED display panel, a touch driving signal line TX or a touch signal receiving line Rx needs to be connected to a flexible printed circuit board (MFPC). On the MFPC, an MFPC multi-layer board design (≥3 layers, usually 6 layers) is adopted, and a wire grounding terminal (GND) layer is inserted to isolate the touch driving signal line TX or the touch signal receiving line Rx from an MIPI signal line displayed, so as to achieve the purpose of shielding signals and reducing noises.

SUMMARY

The disclosure provides a display panel and a displaying device.

In one aspect of the disclosure, a display panel is provided. According to the embodiment of the disclosure, the display panel comprises a bonding area and an active area; a flexible printed circuit board, the flexible printed circuit board being arranged on a side, away from the active area, of the bonding area, and comprising a display signal line which extends in a first direction and is electrically connected to the bonding area; and a touch driving line and a signal receiving line, the touch driving line and the signal receiving line being connected to the flexible printed circuit board from the active area via the bonding area, and the display signal line not overlapping with the touch driving line or the signal receiving line.

According to an embodiment of the disclosure, one of the touch driving line and the signal receiving line is connected to the flexible printed circuit board along a side edge of the bonding area in a second direction; and the other one of the touch driving line and the signal receiving line comprises a first section, a second section, a third section and a fourth section, the first section and the second section are arranged on side edges of two sides of the bonding area in the second direction and extend in the first direction, the third section extends in the second direction and is electrically connected to the first section and the second section, the first section, the second section and the third section are located in the bonding area, the fourth section extends to the flexible printed circuit board from a joint of the second section and the third section, and the third section does not overlap with the display signal line.

According to an embodiment of the disclosure, the bonding area comprises a display panel driving IC, a length direction of the display panel driving IC is parallel to the second direction, and an orthographic projection of the third section in the bonding area overlaps with the display panel driving IC.

According to an embodiment of the disclosure, orthographic projections of the first section and the second section in the bonding area do not overlap with the display panel driving IC.

According to an embodiment of the disclosure, the first section and the second section are arranged on a same layer which is different from a layer where the third section is arranged, the first section is electrically connected to the third section through a first via hole, and the second section is electrically connected to the third section through a second via hole.

According to an embodiment of the disclosure, the bonding area comprises: a first substrate, the third section being located on one side of the first substrate; a first insulating layer arranged on a side, away from the first substrate, of the third section; a first conductive layer arranged on a side, away from the first substrate, of the first insulating layer; a second insulating layer arranged on a side, away from the first substrate, of the first insulating layer and covering the first conductive layer; a second conductive layer arranged on a side, away from the first substrate, of the second insulating layer and electrically connected to the first conductive layer through a third via hole penetrating through the second insulating layer; a third insulating layer arranged on a side, away from the first substrate, of the second insulating layer and covering the second conductive layer; a third conductive layer arranged on a side, away from the first substrate, of the third insulating layer, and electrically connected to the second conductive layer through a fourth via hole penetrating through the third insulating layer; and a fourth insulating layer arranged on a side, away from the first substrate, of the third insulating layer and covering the third conductive layer, a display panel driving IC in the bonding area being located on a side, away from the first substrate, of the fourth insulating layer and electrically connected to the third conductive layer.

According to an embodiment of the disclosure, the first section and the second section are arranged on a surface, away from the first substrate, of the fourth insulating layer, and are electrically connected to the third section through a first via hole and a second via hole.

According to an embodiment of the disclosure, the flexible printed circuit board comprises: a second substrate, the display signal line arranged on one side of the second substrate; a third substrate arranged on a side, away from the second substrate, of the display signal line; a first wire grounding terminal arranged on a side, away from the second substrate, of the third substrate, the fourth section being arranged on a same layer as the first wire grounding terminal; and a fourth substrate arranged on a side, away from the second substrate, of the first wire grounding terminal; wherein, a vertical distance between the fourth substrate and the first section is greater than a vertical distance between the second substrate and the first section.

According to an embodiment of the disclosure, the flexible printed circuit board further comprises: a first signal shielding layer arranged on a side, away from the fourth substrate, of the second substrate; and a second signal shielding layer arranged on a side, away from the second substrate, of the fourth substrate.

According to an embodiment of the disclosure, the flexible printed circuit board further comprises at least one of a power line and a second wire grounding terminal, and both the power line and the second wire grounding terminal are arranged on a same layer as the display signal line.

According to an embodiment of the disclosure, a touch panel of the active area comprises a driving signal line and a receiving signal line; the driving signal line is led out from the touch driving line and connected to the flexible printed circuit board, and the receiving signal line is led out from the signal receiving line and connected to the flexible printed circuit board.

In another aspect of the disclosure, a displaying device is provided. According to the embodiment of the disclosure, the displaying device comprises the aforementioned display panel.

The aforesaid description is merely a brief summary of the technical solution of the disclosure. To allow those skilled in the art to gain a better understanding of the technical means of the disclosure to implement the disclosure according to the contents in the specification and to make the above and other purposes, features and advantages of the disclosure clearer, specific implementations of the disclosure are given below.

BRIEF DESCRIPTION OF THE DRAWINGS

The above and/or additional aspects and advantages of the disclosure will become apparent and easily understood from the description of embodiments taken in conjunction with the following drawings, in which:

FIG. 3 is a structural diagram of a flexible printed circuit board in another embodiment of the disclosure.

DETAILED DESCRIPTION

The solution of the disclosure will be explained in combination with embodiments below. Those skilled in the art will understand that the following embodiments are only used to illustrate the disclosure, and should not be regarded as limiting the scope of the disclosure. Specific techniques or conditions not indicated in the embodiments shall be carried out according to the techniques or conditions described in the literature in this field or according to product specifications.

In an aspect of the disclosure, a display panel is provided. According to the embodiment of the disclosure, referring to FIG. 1, the display panel comprises a bonding area 20 and an active area 10; a flexible printed circuit board 30, the flexible printed circuit board 30 being arranged on a side, away from the active area 10, of the bonding area 20, and comprising a display signal line 60 which extends in a first direction Y and is electrically connected to the bonding area 20; and a touch driving line 41 and a signal receiving line 42, the touch driving line 41 and the signal receiving line 42 being connected to the flexible printed circuit board 30 from the active area 10 via the bonding area 20, and the display signal line 60 not overlapping with the touch driving line 41 or the signal receiving line 42. Since the display signal line does not overlap with the touch driving line or the signal receiving line, that is, the display signal line does not intersect with the touch driving line or the signal receiving line, signals generated by the touch driving line and the signal receiving line will not interfere with signals generated by the display signal line, thus ensuring good touch performance and display performance of the display panel.

It should be noted that a touch panel of the active area 10 comprises a driving signal line (Tx) 43 and a receiving signal line (Rx) 44, the driving signal line 43 is led out from the touch driving line 41 and connected to a driving IC 80 in the flexible printed circuit board 30, and the receiving signal line 44 is led out from the signal receiving line 42 and connected to the driving IC 80 in the flexible printed circuit board 30.

According to the embodiment of the disclosure, there is no special requirement for a specific splicing method between the flexible printed circuit board 30 and the bonding area 20, which may be flexibly selected by those skilled in the art according to actual needs. In some embodiments, the flexible printed circuit board 30 and the bonding area 20 may be bound with glue to be stably spliced together.

Figure 1:
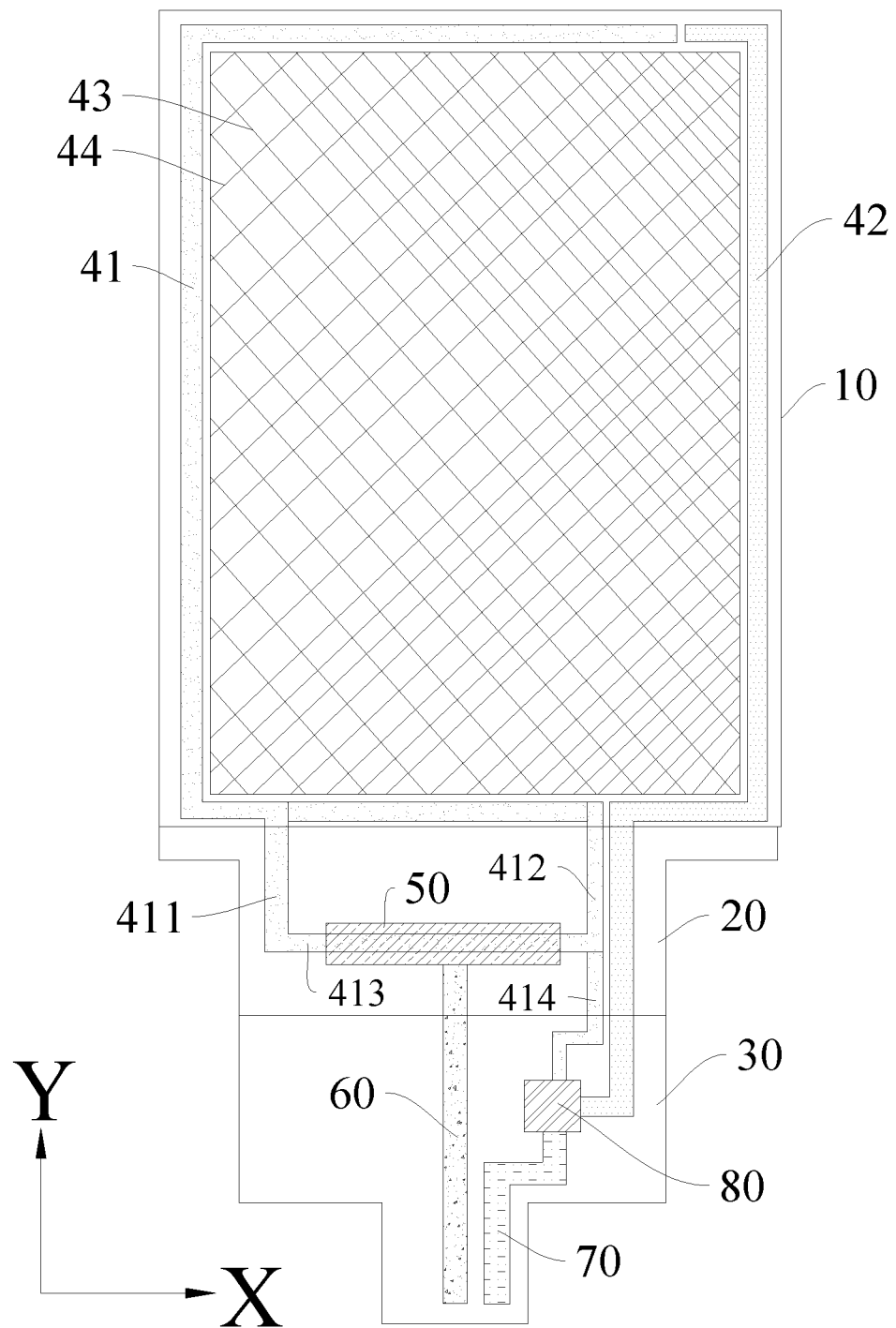
FIG. 1 is a structural diagram of a display panel in an embodiment of the disclosure.

According to the embodiment of the disclosure, referring to FIG. 1, one of the touch driving line 41 and the signal receiving line 42 is connected to the flexible printed circuit board 30 along a side edge of the bonding area 20 in a second direction X; the other one of the touch driving line 41 and the signal receiving line 42 comprises a first section 411, a second section 412, a third section 413 and a fourth section 414 (in FIG. 1, the signal receiving line 42 is along the side edge of the bonding area 20 in the second direction X, and the touch driving line 41 comprises the first section 411, the second section 412, the third section 413 and the fourth section 414); the first section 411 and the second section 412 are arranged on side edges of two sides of the bonding area 20 in the second direction X and extend in the first direction Y; the third section 413 extends in the second direction X and is electrically connected to the first section 411 and the second section 412; and the first section 411, the second section 412 and the third section 413 are located in the bonding area 20, the fourth section 414 extends to the flexible printed circuit board 30 from a joint of the second section 412 and the third section 413, and the third section 413 does not overlap with the display signal line 60. Therefore, compared with the prior art in which the third section is arranged in an area of flexible printed circuit board, by arranging the third section 413 in the bonding area 20 in this disclosure, the situation that the touch driving line 41 and the signal receiving line 42 intersect with the display signal line 60 may be avoided, so that the signals generated by the touch driving line and the signal receiving line will not interfere with the signals generated by the display signal line.

Figure 2:
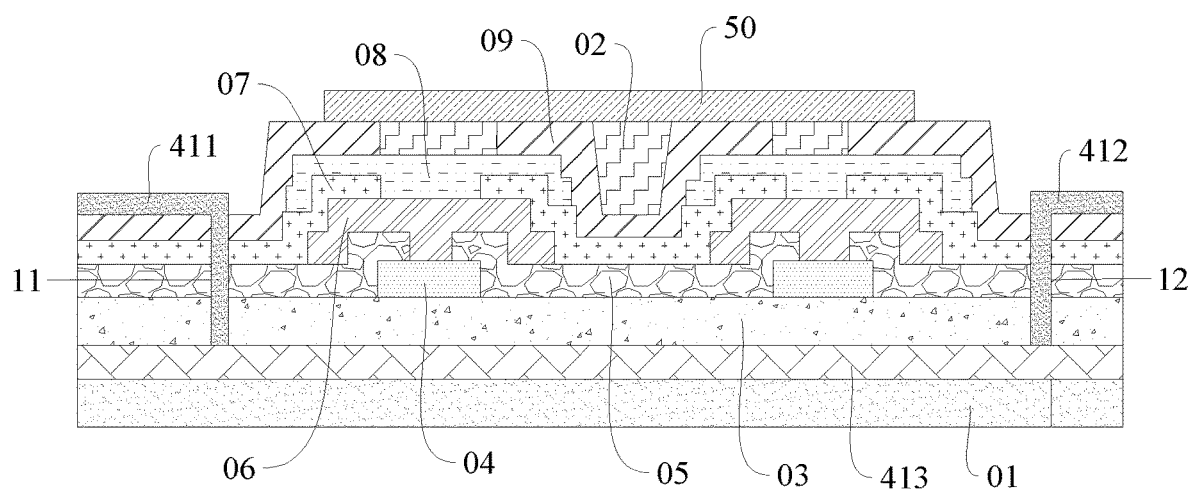
FIG. 2 is a structural diagram of a bonding area in another embodiment of the disclosure.

According to the embodiment of the disclosure, referring to FIGS. 1 and 2 (FIG. 2 is a cross-sectional view corresponding to a display panel driving IC provided in FIG. 1), the bonding area 20 comprises a display panel driving IC 50, wherein a length direction of the display panel driving IC 50 is parallel to the second direction X, and an orthographic projection of the third section 413 in the bonding area 20 overlaps with the display panel driving IC 50. That is to say, the third section 413 is arranged below the display panel driving IC 50, which is not only beneficial to the layout, but also may prevent the touch driving line 41 and the signal receiving line 42 from intersecting with the display signal line 60, thereby avoiding the mutual interference between the signals generated by the touch driving line and the signal receiving line and the signals generated by the display signal line.

According to the embodiment of the disclosure, referring to FIGS. 1 and 2, the first section 411 and the second section 412 are arranged on a same layer which is different from a layer where the third section 413 is arranged, the first section 411 is electrically connected to the third section 413 through a first via hole 11, and the second section 412 is electrically connected to the third section 413 through a second via hole 12. Therefore, the reasonable layout between the third section 413 and the display panel driving IC 50 is facilitated, and the situation that the touch driving line 41 and the signal receiving line 42 intersect with the display signal line 60 may be effectively avoided.

According to the embodiment of the disclosure, as shown in FIGS. 1 and 2, the bonding area 20 comprises a first substrate 01, the third section 413 located on one side of the first substrate 01; a first insulating layer 03 arranged on a side, away from the first substrate 01, of the third section 413; a first conductive layer 04 arranged on a side, away from the first substrate 01, of the first insulating layer 03; a second insulating layer 05 arranged on a side, away from the first substrate 01, of the first insulating layer 03 and covering the first conductive layer 04; a second conductive layer 06 arranged on a side, away from the first substrate 01, of the second insulating layer 05 and electrically connected to the first conductive layer 04 through a third via hole penetrating through the second insulating layer 05; a third insulating layer 07 arranged on a side, away from the first substrate 01, of the second insulating layer 05 and covering the second conductive layer 06; a third conductive layer 08 arranged on a side, away from the first substrate 01, of the third insulating layer 07, and electrically connected to the second conductive layer 06 through a fourth via hole penetrating through the third insulating layer 07; and a fourth insulating layer 09 arranged on a side, away from the first substrate 01, of the third insulating layer 07 and covering the third conductive layer 08, wherein the display panel driving IC 50 is located on a side, away from the first substrate 01, of the fourth insulating layer 09 and is electrically connected to the third conductive layer 08, and the first section 411 and the second section 412 are arranged on a surface, away from the first substrate 01, of the fourth insulating layer 09, and are electrically connected to the third section 413 through the first via hole 11 and the second via hole 12 respectively.

According to the embodiment of the disclosure, referring to FIGS. 1 and 2, orthographic projections of the first section 411 and the second section 412 in the bonding area 20 do not overlap with the display panel driving IC 50. It can be seen from FIG. 2 that the first section 411, the second section 412 and the display panel driving IC 50 are all arranged on a surface of the fourth insulating layer 09, wherein the display panel driving IC 50 is electrically connected to the third conductive layer 08 through a conductive adhesive (such as ACF adhesive) 02.

Figure 3:
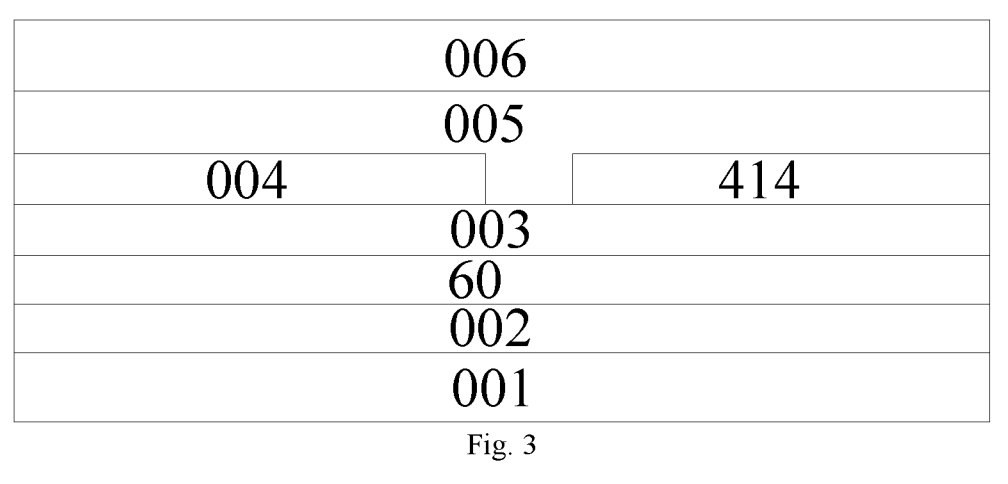

According to the embodiment of the disclosure, referring to FIG. 3, the flexible printed circuit board 30 comprises a second substrate 002, the display signal line 60 arranged on one side of the second substrate 002; a third substrate 003 arranged on a side, away from the second substrate 002, of the display signal line 60; a first wire grounding terminal 004 arranged on a side, away from the second substrate 002, of the third substrate 003, the fourth section 414 being arranged on a same layer as the first wire grounding terminal 004; and a fourth substrate 005 arranged on a side, away from the second substrate 002, of the first wire grounding terminal (GND) 004, wherein a vertical distance between the fourth substrate 005 and the first section 411 is greater than a vertical distance between the second substrate 002 and the first section 411 (that is, the fourth substrate is arranged near a display side of the display panel). Therefore, the display signal line 60, the first wire grounding terminal 004, and the fourth section 414 are arranged in two conductive structural layers. Compared with three or more conductive structural layers in the prior art, the flexible printed circuit board of the disclosure is thinner, and the manufacturing cost of the flexible printed circuit board may also be reduced.

According to the embodiment of the disclosure, the flexible printed circuit board further comprises at least one of a power line and a second wire grounding terminal (GND), and both the power line and the second wire grounding terminal are arranged on a same layer as the display signal line. Therefore, by arranging the display signal line 60, the first wire grounding terminal 004, the fourth section 414, the power line and the second wire grounding terminal (GND) in the two conductive structural layers, a small thickness of the flexible printed circuit board is effectively ensured, which is conductive to realizing the lightness of the flexible printed circuit board.

Further, referring to FIG. 3, the flexible printed circuit board may further comprise a first signal shielding layer 001 and a second signal shielding layer 006, wherein the first signal shielding layer is arranged on a side, away from the fourth substrate 005, of the second substrate 002, and the second signal shielding layer 006 is arranged on a side, away from the second substrate 002, of the fourth substrate 005.

Further, there is no particular requirement for the specific types of the second substrate, the third substrate and the fourth substrate, which may be flexibly selected by those skilled in the art according to actual needs, such as polymer substrates like PI substrates or glass substrates.

Further, referring to FIG. 1, the flexible printed circuit board may further comprise a signal line 70 for communication between systems.

In another aspect of the disclosure, a displaying device is provided. According to the embodiment of the disclosure, the displaying device comprises the aforementioned display panel. Therefore, touch signals and display signals of the displaying device are stable, so that the touch performance and display effect of the displaying device are great. Those skilled in the art may understand that the displaying device has all the features and advantages of the above-mentioned display panel, which will not be described in detail here.

Those skilled in the art may understand that the displaying device may also comprise necessary structures and components in conventional displaying devices in addition to the aforementioned display panel. Taking a mobile phone as an example, the displaying device may also comprise necessary structures and components such as a middle frame, a battery cover, a battery, an audio module, and a camera module in addition to the aforementioned display panel.

According to the embodiment of the disclosure, there is no particular requirement for the specific type of the displaying device, which may be flexibly selected by those skilled in the art according to actual needs. In some embodiments, the specific types of the displaying device include, but are not limited to, mobile phones, notebooks, game machines, iPad, Kindle and all touch displaying devices with a display function.

In this specification, descriptions referring to the terms "one embodiment", "some embodiments", "example", "specific example", or "some examples" mean that specific features, structures, materials or characteristics described in connection with this embodiment or example are included in at least one embodiment or example of this disclosure. In this specification, the schematic expressions of these terms do not necessarily refer to the same embodiments or examples. Furthermore, the specific features, structures, materials or characteristics described may be combined in any one or more embodiments or examples in a suitable manner. In addition, those skilled in the art may combine different embodiments or examples and features of different embodiments or examples described in this specification without contradicting each other.

Although the embodiments of the disclosure have been shown and described above, it can be understood that the above-mentioned embodiments are exemplary and cannot be understood as limiting the disclosure, and those of ordinary skill in the art can make changes, modifications, substitutions and variations to the above-mentioned embodiments within the scope of the disclosure.

The invention claimed is:

1. A display panel, comprising:
   a bonding area and an active area;
   a flexible printed circuit board arranged on a side, away from the active area, of the bonding area, wherein the flexible printed circuit board comprises a display signal line which extends in a first direction and is electrically connected to the bonding area; and
   a touch driving line and a signal receiving line, wherein the touch driving line and the signal receiving line are connected to the flexible printed circuit board from the active area via the bonding area, and the display signal line does not overlap with the touch driving line or the signal receiving line;
   wherein one of the touch driving line and the signal receiving line is connected to the flexible printed circuit board along a side edge of the bonding area in a second direction; and
   the other one of the touch driving line and the signal receiving line comprises a first section, a second section, a third section and a fourth section, the first section and the second section are arranged on side edges of two sides of the bonding area in the second direction and extend in the first direction, the third section extends in the second direction and is electrically connected to the first section and the second section, the first section, the second section and the third section are located in the bonding area, the fourth section extends to the flexible printed circuit board from a joint of the second section and the third section, and the third section does not overlap with the display signal line;
   wherein the flexible printed circuit board comprises:
   a second substrate, wherein the display signal line is arranged on one side of the second sub state;
   a third substrate arranged on a side, away from the second substrate, of the display signal line:
   a first wire grounding terminal arranged on a side, away from the second substrate, of the third substrate, wherein the fourth section is arranged on a same layer as the first wire grounding terminal; and
   a fourth substrate arranged on a side, away from the second substrate, of the first wire grounding terminal;
   wherein, a vertical distance between the fourth substrate and the first section is greater than a vertical distance between the second substrate and the first section.

2. The display panel according to claim 1, wherein the bonding area comprises a display panel driving IC, a length direction of the display panel driving IC is parallel to the second direction, and an orthographic projection of the third section in the bonding area overlaps with the display panel driving IC.

3. The display panel according to claim 2, wherein orthographic projections of the first section and the second section in the bonding area do not overlap with the display panel driving IC.

4. The display panel according to claim 1, wherein the first section and the second section are arranged on a same layer which is different from a layer where the third section is arranged, the first section is electrically connected to the third section through a first via hole, and the second section is electrically connected to the third section through a second via hole.

5. The display panel according to claim 1, wherein the bonding area comprises:
   a first substrate, wherein the third section is located on one side of the first substrate;
   a first insulating layer arranged on a side, away from the first substrate, of the third section;
   a first conductive layer arranged on a side, away from the first substrate, of the first insulating layer;
   a second insulating layer arranged on a side, away from the first substrate, of the first insulating layer and covering the first conductive layer;
   a second conductive layer arranged on a side, away from the first substrate, of the second insulating layer and electrically connected to the first conductive layer through a third via hole penetrating through the second insulating layer;
   a third insulating layer arranged on a side, away from the first substrate, of the second insulating layer and covering the second conductive layer;
   a third conductive layer arranged on a side, away from the first substrate, of the third insulating layer, and electrically connected to the second conductive layer through a fourth via hole penetrating through the third insulating layer; and
   a fourth insulating layer arranged on a side, away from the first substrate, of the third insulating layer and covering the third conductive layer, wherein a display panel driving IC in the bonding area is located on a side, away from the first substrate, of the fourth insulating layer and electrically connected to the third conductive layer.

6. The display panel according to claim 5, wherein the first section and the second section are arranged on a surface, away from the first substrate, of the fourth insulating layer, and are electrically connected to the third section through a first via hole and a second via hole.

7. The display panel according to claim 1, wherein the flexible printed circuit board further comprises:
   a first signal shielding layer arranged on a side, away from the fourth substrate, of the second substrate; and
   a second signal shielding layer arranged on a side, away from the second substrate, of the fourth substrate.

8. The display panel according to claim 1, wherein the flexible printed circuit board further comprises at least one of a power line and a second wire grounding terminal, and both the power line and the second wire grounding terminal are arranged on a same layer as the display signal line.

9. The display panel according to claim 1, wherein a touch panel of the active area comprises a driving signal line and a receiving signal line; and
   the driving signal line is led out from the touch driving line and connected to the flexible printed circuit board, and the receiving signal line is led out from the signal receiving line and connected to the flexible printed circuit board.

10. A displaying device, comprising the display panel according to claim 1.

* * * * *